(12) United States Patent
Richez et al.

(10) Patent No.: US 12,157,252 B2
(45) Date of Patent: Dec. 3, 2024

(54) IMPRINTING APPARATUS INCLUDING SILICON MASTER WITH A PLURALITY OF NANOFEATURES AND AN ANTI-STICK LAYER HAVING A CYCLOSILOXANE AND METHOD OF FORMING

(71) Applicants: Illumina, Inc., San Diego, CA (US); Illumina Cambridge Limited, Cambridge (GB)

(72) Inventors: Alexandre Richez, Cambridge (GB); Andrew A. Brown, Cambridge (GB); Julia Morrison, Grays (GB); Wayne N. George, Ilford (GB); Timothy J. Merkel, San Diego, CA (US); Audrey Rose Zak, Carlsbad, CA (US)

(73) Assignees: Illumina, Inc., San Diego, CA (US); Illumina Cambridge Limited, Cambridge (GB)

( * ) Notice: Subject to any disclaimer, the term of this patent is extended or adjusted under 35 U.S.C. 154(b) by 0 days.

(21) Appl. No.: 17/541,089

(22) Filed: Dec. 2, 2021

(65) Prior Publication Data
US 2022/0088834 A1    Mar. 24, 2022

Related U.S. Application Data

(63) Continuation of application No. 15/847,150, filed on Dec. 19, 2017, now Pat. No. 11,213,976.
(Continued)

(51) Int. Cl.
B29C 33/38        (2006.01)
B29C 33/40        (2006.01)
(Continued)

(52) U.S. Cl.
CPC .......... *B29C 33/3842* (2013.01); *B29C 33/40* (2013.01); *B29C 59/026* (2013.01);
(Continued)

(58) Field of Classification Search
CPC ... B29C 33/3842; B29C 59/026; B29C 33/40; C09D 133/26; C09D 4/00; G03F 7/0002; B29L 2031/752; B29K 2883/00
See application file for complete search history.

(56) References Cited

U.S. PATENT DOCUMENTS 4,550,035 A    10/1985   Smith
5,004,502 A    4/1991    Ramzan
(Continued)

FOREIGN PATENT DOCUMENTS

CA        2895137 A1 *    9/2014    .......... B01J 19/0046
CN      101075443 A        11/2007
(Continued)

OTHER PUBLICATIONS

JP 2004/174757 translation (Year: 2023).*
(Continued)

*Primary Examiner* — Jeffrey M Wollschlager
*Assistant Examiner* — Guy F Mongelli
(74) *Attorney, Agent, or Firm* — Dierker & Kavanaugh, P.C.

(57) ABSTRACT

An imprinting apparatus includes a silicon master having a plurality of nanofeatures defined therein. An anti-stick layer coats the silicon master, the anti-stick layer including a molecule having a cyclosiloxane with at least one silane functional group. A method includes forming a master template by: depositing a formulation on a silicon master including a plurality of nanofeatures defined therein, the formulation including a solvent and a molecule having a cyclosiloxane with at least one silane functional group; and
(Continued)

curing the formulation, thereby forming an anti-stick layer on the silicon master, the anti-stick layer including the molecule. The method further includes depositing a silicon-based working stamp material on the anti-stick layer of the master template; curing the silicon-based working stamp material to form a working stamp including a negative replica of the plurality of nanofeatures; and releasing the working stamp from the master template.

23 Claims, 6 Drawing Sheets

Related U.S. Application Data

(60) Provisional application No. 62/438,237, filed on Dec. 22, 2016.

(51) Int. Cl.
| | | |
|---|---|---|
| *B29C 59/02* | (2006.01) | |
| *B29L 31/00* | (2006.01) | |
| *B81C 1/00* | (2006.01) | |
| *C09D 4/00* | (2006.01) | |
| *C09D 133/26* | (2006.01) | |
| *G03F 7/00* | (2006.01) | |

(52) U.S. Cl.
CPC .......... *B81C 1/0046* (2013.01); *C09D 133/26* (2013.01); *G03F 7/0002* (2013.01); *B29K 2883/00* (2013.01); *B29L 2031/752* (2013.01); *C09D 4/00* (2013.01)

(56) References Cited

U.S. PATENT DOCUMENTS

| | | | |
|---|---|---|---|
| 5,112,393 A * | 5/1992 | Engel | C09D 183/04 428/447 |
| 5,164,278 A | 11/1992 | Brunsvold et al. | |
| 5,330,925 A * | 7/1994 | Lee | H01L 29/6659 438/303 |
| 5,378,790 A * | 1/1995 | Michalczyk | C08G 77/50 528/25 |
| 5,387,494 A * | 2/1995 | Barr | G03F 7/075 430/910 |
| 5,767,206 A | 6/1998 | Ariagno et al. | |
| 6,121,130 A | 9/2000 | Chua et al. | |
| 6,309,580 B1 | 10/2001 | Chou | |
| 6,814,898 B1 * | 11/2004 | Deeman | G11B 5/743 |
| 7,604,836 B2 | 10/2009 | Guo et al. | |
| 7,854,873 B2 | 12/2010 | Heidari et al. | |
| 8,877,882 B1 | 11/2014 | Salamone et al. | |
| 9,012,022 B2 | 4/2015 | George et al. | |
| 9,335,628 B2 | 5/2016 | Kodama | |
| 10,682,829 B2 | 6/2020 | Bowen et al. | |
| 11,213,976 B2 * | 1/2022 | Richez | B29C 59/026 |
| 2001/0036591 A1 * | 11/2001 | Schulz | C08G 65/105 522/31 |
| 2002/0081520 A1 * | 6/2002 | Sooriyakumaran | G03F 7/0046 430/311 |
| 2003/0141276 A1 * | 7/2003 | Lee | B82Y 10/00 216/8 |
| 2003/0198739 A1 | 10/2003 | Mager et al. | |
| 2004/0024089 A1 | 2/2004 | Busch et al. | |
| 2004/0176503 A1 * | 9/2004 | Czayka | C08F 283/01 525/242 |
| 2004/0219246 A1 * | 11/2004 | Jeans | B82Y 10/00 425/363 |
| 2005/0038180 A1 * | 2/2005 | Jeans | G03F 7/0002 524/588 |
| 2005/0064344 A1 * | 3/2005 | Bailey | B82Y 40/00 430/323 |
| 2005/0089803 A1 | 4/2005 | Bouaidat et al. | |
| 2005/0116387 A1 * | 6/2005 | Davison | H05K 3/005 264/293 |
| 2005/0184397 A1 | 8/2005 | Gates et al. | |
| 2006/0012967 A1 | 1/2006 | Asai et al. | |
| 2006/0021967 A1 | 2/2006 | Lee | |
| 2006/0097359 A1 * | 5/2006 | Goodner | H01L 21/3122 257/632 |
| 2006/0110940 A1 | 5/2006 | Seon et al. | |
| 2006/0155074 A1 | 7/2006 | Kudo et al. | |
| 2006/0159938 A1 | 7/2006 | Lee et al. | |
| 2007/0160547 A1 * | 7/2007 | Duffy | A61K 31/74 424/59 |
| 2007/0221448 A1 | 9/2007 | Kudo et al. | |
| 2007/0264481 A1 * | 11/2007 | DeSimone | A61K 9/5138 977/773 |
| 2008/0089712 A1 | 4/2008 | Nukada et al. | |
| 2008/0131692 A1 | 6/2008 | Rolland et al. | |
| 2008/0145525 A1 | 6/2008 | Guo et al. | |
| 2009/0014965 A1 | 1/2009 | Kudo et al. | |
| 2009/0252975 A1 | 10/2009 | Lee et al. | |
| 2009/0269942 A1 | 10/2009 | Shin et al. | |
| 2010/0119744 A1 * | 5/2010 | Yokoyama | C12P 9/00 526/279 |
| 2010/0206470 A1 * | 8/2010 | Chen | B82Y 40/00 264/225 |
| 2010/0308009 A1 | 12/2010 | Zhu et al. | |
| 2011/0039033 A1 | 2/2011 | Merschrod et al. | |
| 2011/0059865 A1 | 3/2011 | Smith et al. | |
| 2012/0168404 A1 * | 7/2012 | Lee | B82Y 10/00 216/44 |
| 2013/0059121 A1 | 3/2013 | Veinot et al. | |
| 2013/0081687 A1 * | 4/2013 | Wu | H01L 31/182 438/57 |
| 2013/0122135 A1 * | 5/2013 | Petrzelka | G03F 7/0002 264/225 |
| 2013/0122423 A1 * | 5/2013 | Echigo | C07C 43/307 430/326 |
| 2013/0143002 A1 * | 6/2013 | Kurataka | B32B 1/08 427/256 |
| 2014/0079923 A1 | 3/2014 | George et al. | |
| 2014/0094004 A1 | 4/2014 | Kamath et al. | |
| 2014/0120678 A1 | 5/2014 | Shinriki et al. | |
| 2014/0200158 A1 | 7/2014 | Bowen et al. | |
| 2014/0200425 A1 * | 7/2014 | Etzkorn | A61B 5/1455 205/122 |
| 2015/0005447 A1 | 1/2015 | Berti et al. | |
| 2015/0136173 A1 | 5/2015 | Yamada et al. | |
| 2015/0175821 A1 | 6/2015 | Moorlag et al. | |
| 2015/0380524 A1 * | 12/2015 | Ishihara | H01L 29/04 257/66 |
| 2016/0023208 A1 | 1/2016 | Fisher et al. | |
| 2016/0237020 A1 * | 8/2016 | Spence | C01B 21/0823 |
| 2016/0246170 A1 | 8/2016 | Bowen et al. | |
| 2017/0158905 A1 * | 6/2017 | Oomatsu | C09D 151/08 |
| 2018/0178416 A1 * | 6/2018 | Richez | B29C 59/026 |
| 2018/0333977 A1 * | 11/2018 | Van Den Berg | B29C 59/026 |
| 2019/0011827 A1 * | 1/2019 | Shimizu | G03F 7/325 |
| 2021/0328246 A1 * | 10/2021 | Agapov | B32B 23/08 |

FOREIGN PATENT DOCUMENTS

| | | | | |
|---|---|---|---|---|
| CN | 101449206 A | 6/2009 | | |
| CN | 101842745 A | 9/2010 | | |
| CN | 103052492 A | 4/2013 | | |
| CN | 105874385 A | 8/2016 | | |
| CN | 105903796 A | 8/2016 | | |
| DE | 19631227 C1 | 4/1998 | | |
| EP | 0475437 A1 | 3/1992 | | |
| EP | 2424949 A1 | 3/2012 | | |
| JP | 2004066447 A | 3/2004 | | |
| JP | 2004148506 A | 5/2004 | | |
| JP | 2004174757 A | * | 6/2004 | .......... B01J 19/0046 |
| JP | 2004325172 A | 11/2004 | | |
| JP | 2005330429 A | 12/2005 | | |
| JP | 2007176949 A | * | 7/2007 | ............... C07F 7/20 |
| JP | 2010084162 A | 4/2010 | | |
| JP | 2010229324 A | 10/2010 | | |
| JP | 2010280159 A | 12/2010 | | |

(56) References Cited

FOREIGN PATENT DOCUMENTS

| | | |
|---|---|---|
| JP | 2012248641 A | 12/2012 |
| JP | 2013138179 A | 7/2013 |
| JP | 2016160285 A | 9/2016 |
| JP | 2017504183 A | 2/2017 |
| KR | 0149903 B1 * | 3/1993 |
| KR | 1020140110543 A | 9/2014 |
| RU | 2150154 C1 | 5/2000 |
| WO | 0031148 A2 | 6/2000 |
| WO | 0101143 A2 | 1/2001 |
| WO | 0114493 A2 | 3/2001 |
| WO | 03014392 A2 | 2/2003 |
| WO | 2012060620 A2 | 5/2012 |
| WO | 2015002813 A1 | 1/2015 |
| WO | 2015095291 A1 | 6/2015 |

OTHER PUBLICATIONS

Ro, H.W., et al. "Cubic Silsesquioxanes as a Green, High-Performance Mold Material for Nanoimprint Lithography", Adv. Mater., pp. 414-420, 2011.

CN 105903796 "WIPO Patentscope Translation of Specification and Claims", 2021.
CN104817702 "WIPO Patentscope Translation of Specification and Claims", 2021.
EP2424949 "WIPO Patentscope Translation of Specification and Claims", 2021.
JP 2005/330429 "WIPO Patentscope Translation of Specification and Claims", 2021.
JP 2016/160285 "WIPO Patentscope Translation of Specification and Claims", 2021.
KR 0149903 "WIPO Patentscope Translation", 2021.
SciFinder "Molecular Search Results", 2021.
STIC "Molecular Search Results", 2021.
STN "Next Molecular Search Results", 2021.
WO0114493A2 "WIPO Patentscope Translation of Specification and Claims", 2021.
WO2015/095291 "WIPO Patentscope Translation of Specification and Claims", 2021.
ISA "International Search Report and Written Opinion for International Application No. PCT/US2017/067333, 16 pages", 43217.

* cited by examiner

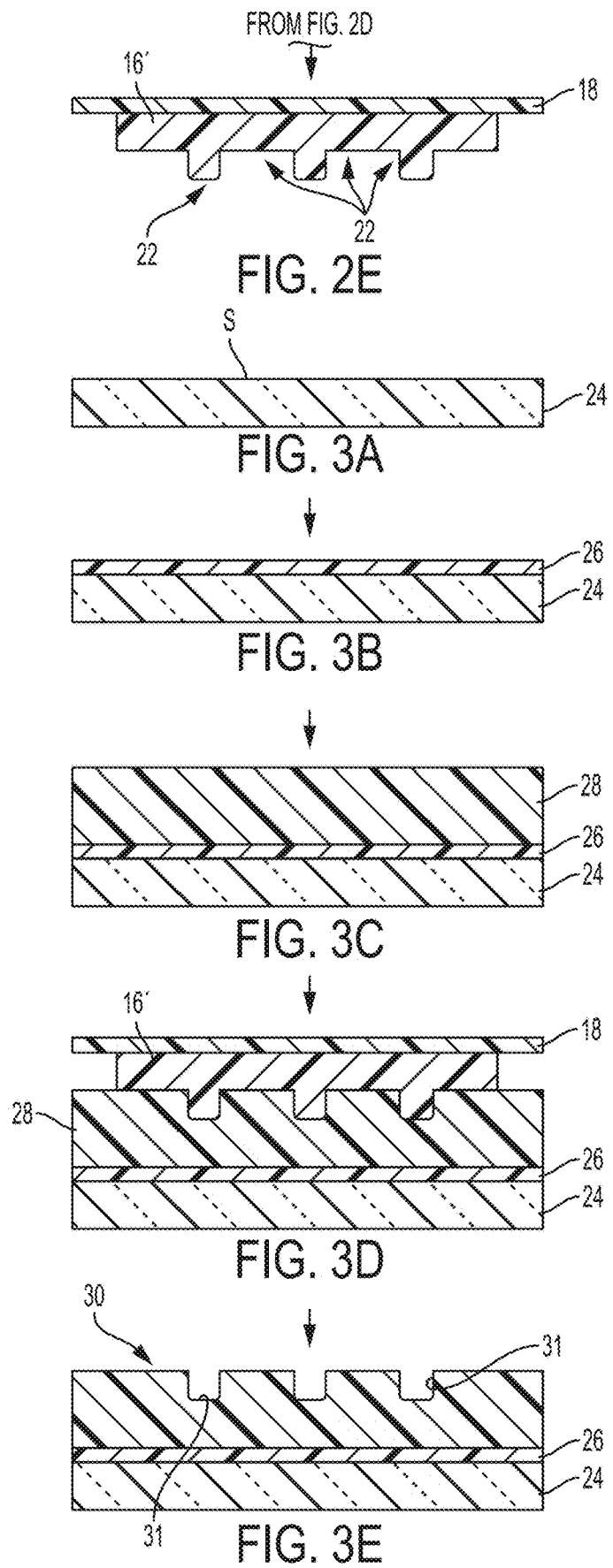

IMPRINTING APPARATUS INCLUDING SILICON MASTER WITH A PLURALITY OF NANOFEATURES AND AN ANTI-STICK LAYER HAVING A CYCLOSILOXANE AND METHOD OF FORMING

CROSS-REFERENCE TO RELATED APPLICATIONS

This application is a continuation of U.S. application Ser. No. 15/847,150, filed Dec. 19, 2017, which itself claims the benefit of U.S. Provisional Application Ser. No. 62/438,237, filed Dec. 22, 2016, the contents of each of which is incorporated by reference herein in its entirety.

BACKGROUND

Nano-imprinting technology enables the economic and effective production of nanostructures. Nano-embossing lithography employs direct mechanical deformation of a resist material by a stamp having nanostructures, followed by an etching process to transfer the nanostructures from the stamp to the substrate.

Flow cells are devices that allow fluid flow through channels or wells within a substrate. Patterned flow cells that are useful in nucleic acid analysis methods include discrete wells of active surface within an inert interstitial region. Such patterned flow cells may be useful in biological arrays.

Biological arrays are among a wide range of tools used to detect and analyze molecules, including deoxyribonucleic acid (DNA) and ribonucleic acid (RNA). In these applications, the arrays are engineered to include probes for nucleotide sequences present in genes in humans and other organisms. In certain applications, for example, individual DNA and RNA probes may be attached at small locations in a geometric grid (or randomly) on an array support. A test sample, e.g., from a known person or organism, may be exposed to the grid, such that complementary fragments hybridize to the probes at the individual sites in the array. The array can then be examined by scanning specific frequencies of light over the sites to identify which fragments are present in the sample, by fluorescence of the sites at which the fragments hybridized.

Biological arrays may be used for genetic sequencing. In general, genetic sequencing involves determining the order of nucleotides or nucleic acids in a length of genetic material, such as a fragment of DNA or RNA. Increasingly longer sequences of base pairs are being analyzed, and the resulting sequence information may be used in various bioinformatics methods to logically fit fragments together so as to reliably determine the sequence of extensive lengths of genetic material from which the fragments were derived. Automated, computer-based examination of characteristic fragments have been developed, and have been used in genome mapping, identification of genes and their function, evaluation of risks of certain conditions and disease states, and so forth. Beyond these applications, biological arrays may be used for the detection and evaluation of a wide range of molecules, families of molecules, genetic expression levels, single nucleotide polymorphisms, and genotyping.

SUMMARY

An example of an imprinting apparatus includes a silicon master having a plurality of nanofeatures defined therein. An example anti-stick layer coats the silicon master, the anti-stick layer including a molecule having a cyclosiloxane with at least one silane functional group.

An example of a method includes forming a master template by: depositing a formulation on a silicon master including a plurality of nanofeatures defined therein, the formulation including a solvent and a molecule having a cyclosiloxane with at least one silane functional group; and curing the formulation, thereby forming an anti-stick layer on the silicon master, the anti-stick layer including the molecule. The method further includes depositing a silicon-based working stamp material on the anti-stick layer of the master template; curing the silicon-based working stamp material to form a working stamp including a negative replica of the plurality of nanofeatures; and releasing the working stamp from the master template.

BRIEF DESCRIPTION OF THE DRAWINGS

Features and advantages of examples of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

FIGS. 2A-2E together semi-schematically illustrate an example of a method of forming a working stamp;

FIGS. 3A-3E together semi-schematically illustrate an example of a method of forming surface using an example of the working stamp;

INTRODUCTION

Figure 1:
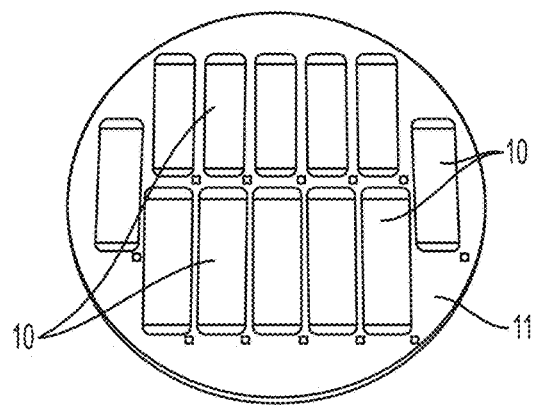
FIG. 1 is a top view of an example silicon master wafer.

In an aspect, an imprinting apparatus comprises a silicon master including a plurality of nanofeatures defined therein. An anti-stick layer coats the silicon master, the anti-stick layer including a molecule having a cyclosiloxane with at least one silane functional group.

In some examples of this aspect, the cyclosiloxane with at least one silane functional group is a cyclosiloxane (such as a cyclotetrasiloxane, a cyclopentasiloxane, or a cyclohexasiloxane) substituted with at least one unsubstituted $C_{1-6}$alkyl group and with at least one $C_{1-12}$alkyl group substituted with an alkoxysilane group. In other examples of this aspect, the cyclosiloxane with at least one silane functional group is a cyclosiloxane (such as a cyclotetrasiloxane, cyclopentasiloxane, or a cyclohexasiloxane) substituted with four unsubstituted $C_{1-6}$alkyl groups and four $C_{1-12}$alkyl groups each substituted with an alkoxysilane group. In some examples, the $C_{1-6}$alkyl groups are methyl groups. In other examples, the $C_{1-12}$alkyl groups are each substituted with a trialkoxysilane group, and in some examples are substituted ethyl or propyl groups, and in some examples, are substituted ethyl groups. In some examples, the alkoxysilane is a monoalkoxysilane. In some examples, the alkoxysilane is a trialkoxysilane. In some examples, the trialkoxysilane group is a trimethoxysilane or triethoxysilane. In some examples, the trialkoxysilane group is a triethoxysilane. In some examples, the anti-stick layer comprises a mixture of cyclosiloxanes.

In one example of this aspect, the molecule is:

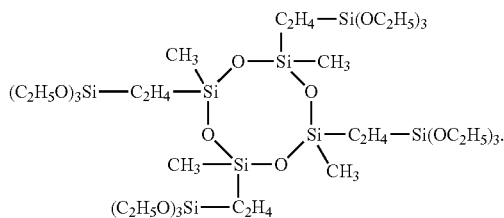

In one example of this aspect, the anti-stick layer includes a mixture of the molecule in its neat form and an oligomer of the molecule. In another example of this aspect, the anti-stick layer includes a mixture of the molecule and at least one other cyclosiloxane.

In one example of this aspect, the cyclosiloxane is selected from the group consisting of cyclotetrasiloxane and cyclohexasiloxane.

In one example of this aspect, the silane functional group is an alkyl alkoxysilane.

In one example of this aspect, the alkyl alkoxysilane is ethyl triethoxysilane.

In one example of this aspect, the imprinting apparatus further comprises a silicon-based working stamp in contact with the anti-stick layer on the silicon master.

In one example of this aspect, the silicon-based working stamp includes polymerized silicon acrylate monomers.

In one example of this aspect, the imprinting apparatus further comprises a backplane in contact with the working stamp.

In one example of this aspect, the molecule excludes fluorine. In some examples, the anti-stick layer excludes fluorine, or excludes fluorine-containing compounds.

It is to be understood that any features of this aspect of the imprinting apparatus may be combined together in any desirable manner and/or configuration.

In an aspect, a method comprises forming a master template by depositing a formulation on a silicon master including a plurality of nanofeatures defined therein. The formulation includes a solvent and a molecule having a cyclosiloxane with at least one silane functional group. In some aspects, the method comprises cleaning the surface of the silicon master, e.g., by plasma ashing or chemical cleaning, prior to depositing the formulation. The method further includes curing the formulation, thereby forming an anti-stick layer on the silicon master, the anti-stick layer including the molecule. The method further includes depositing a silicon-based working stamp material on the anti-stick layer of the master template, and curing the silicon-based working stamp material to form a working stamp including a negative replica of the plurality of nanofeatures. The method also includes releasing the working stamp from the master template. In some aspects, the silicon master includes silicon or a silicon-$SiO_2$ layered material.

In one example of this aspect of the method, the solvent has a boiling point of less than about 70° C. In some examples, the molecule is present in the formulation in an amount of at least about 5 wt %.

In one example of this aspect of the method, the solvent is tetrahydrofuran or toluene, and/or the molecule is:

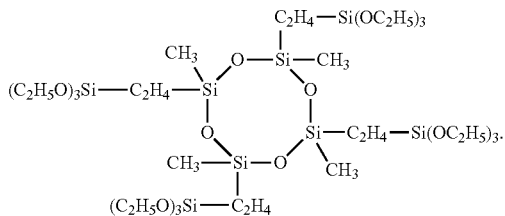

In one example of this aspect of the method, the depositing of the formulation and the depositing of the silicon-based working stamp material each involve spin coating.

In one example of this aspect of the method, the silicon-based working stamp material includes a silicon acrylate monomer.

In one example of this aspect of the method, the molecule is present in the formulation in an amount ranging from about 5 wt % to about 10 wt %.

In some aspects, the releasing serves to release the working stamp from the master template and from the cured anti-stick layer. In one example of this aspect of the method, the released working stamp is at least substantially free of the molecule.

In some aspects, the released master template is reused to prepare further iterations of working stamps (e.g., more than 1, more than 5, more than 10, more than 25, more than 50, 1 to 10, 1 to 25, 1 to 50, 25 to 50, etc.). In some aspects, the released master template comprises the anti-stick layer, and is reused without reapplication of the anti-stick layer. In some aspects, the reuse of the released master template comprises depositing a second silicon-based working stamp material on the anti-stick layer of the released master template; curing the second silicon-based working stamp material to form a second working stamp including a negative replica of the plurality of nanofeatures; and releasing the second working stamp from the released master template. In some aspects, the reuse process is repeated multiple times (e.g., 2, 5, 10, 25, or 50 times). In some aspects, the reuse of the released master template comprises reapplication of the anti-stick layer, and thus comprises depositing a formulation including a solvent and a molecule having a cyclosiloxane with at least one silane functional group on the released master template; curing the formulation, thereby forming an anti-stick layer on the released master template, the anti-stick layer including the molecule; depositing a silicon-based working stamp material on the anti-stick layer of the released master template; curing the silicon-based working stamp material to form a second working stamp including a negative replica of the plurality of nanofeatures; and releasing the second working stamp from the released master template. In some aspects, the reuse method comprises cleaning the released master template, e.g., by plasma ashing or chemical cleaning, prior to depositing the formulation. This process may be repeated multiple times (e.g. 2, 5, 10, 25, or 50 times) using the same master template.

It is to be understood that any features of this aspect of the method may be combined together in any desirable manner. Moreover, it is to be understood that any combination of features of this aspect of the method and/or of the aspect of the imprinting apparatus may be used together, and/or that any features from either or both of these aspects may be combined with any of the examples disclosed herein.

In an aspect, a method of using a working stamp (having been formed by the aspect(s) of the method discussed above) comprises imprinting the working stamp into an imprint lithography resin on a support; and curing the resin, thereby forming a sequencing surface having a replication (e.g., negative replication of the working stamp features, thus matching the original master template features) of the plurality of nanofeatures defined therein.

In one example of this aspect of the method of use, the sequencing surface is at least substantially free of the molecule.

In one example of this aspect of the method of use, the method further comprises grafting amplification primers onto an intermediate structure present in the replication of the plurality of nanofeatures. In another aspect of the method of use, the method further comprises grafting an intermediate structure to the patterned sequencing surface in the replication of the plurality of nanofeatures defined therein. In another aspect, the method further comprises grafting amplification primers to the intermediate structure in the replication of the plurality of nanofeatures on the sequencing surface.

In one example of this aspect of the method of use, the intermediate structure is a polymer coating including a recurring unit of Formula (I):

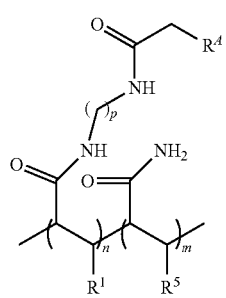

(I)

wherein:
$R^1$ is H or optionally substituted alkyl;
$R^4$ is selected from the group consisting of azido, optionally substituted amino, optionally substituted alkenyl, optionally substituted hydrazone, optionally substituted hydrazine, carboxyl, hydroxy, optionally substituted tetrazole, optionally substituted tetrazine, nitrile oxide, nitrone, and thiol;
$R^5$ is selected from the group consisting of H and optionally substituted alkyl;
each of the $-(CH_2)_p-$ can be optionally substituted;
p is an integer in the range of 1 to 50;
n is an integer in the range of 1 to 50,000; and
m is an integer in the range of 1 to 100,000.

One of ordinary skill in the art will recognize that the arrangement of the recurring "n" and "m" features in Formula (I) are representative, and the monomeric subunits may be present in any order in the polymer structure (e.g., random, block, patterned, or a combination thereof).

It is to be understood that any features of this aspect of the method of use may be combined together in any desirable manner. Moreover, it is to be understood that any combination of features of this aspect of the method of use and/or of the aspect of the method and/or of the aspect of the imprinting apparatus may be used together, and/or that any features from either or both of these aspects may be combined with any of the examples disclosed herein.

DETAILED DESCRIPTION

Introducing patterning technology (localized and independent clusters) into genetic sequencing can improve sequencing quality. However, creating patterned flow cells by traditional lithographic techniques (pattern definition through the use of photons or electrons) involves high class cleanrooms and many processing steps per wafer.

Examples of the present disclosure may advantageously be scalable from die-level processes to wafer-level processes.

Nanoimprint lithography (NIL) may be a relatively high-throughput patterning technique offering high precision and low costs. However, the present inventors discovered that standard NIL in several instances is generally not suitable for use in flow cell manufacturing (e.g., due to the sequencing surface complexity from the feature sizes, etc.), nor able to effectively support genetic sequencing surface chemistry.

The fabrication of imprinted wafers using NIL in general involves i) fabrication of a working stamp (WS) (negative replicate of the master); and replication of the master pattern (model) into a resin matrix using the initially made WS (imprinting process).

However, it was discovered that the fabrication of the WS could not be automated using the pre-existing setup and materials. Once spin coated on a master coated with an anti-stick layer (ASL), the WS formulation was de-wetting too quickly from the surface to repeatably provide a suitable stamp. The WS fabrication step had a low success rate, thus making the overall NIL process unusable for automated production. Not to be bound by any particular theory, but the present inventors believe that a surface energy mismatch between the coated master and the WS material might have contributed to this phenomenon.

Examples of the present disclosure describe a new class of material to be used as an efficient ASL. The resulting example ASL-coated master offers stable WS formulation wetting, thus leading to a systematic successful WS fabrication process. Further, the process may be automated with a high success rate.

It is to be understood that terms used herein will take on their ordinary meaning in the relevant art unless specified otherwise. Several terms used herein and their meanings are set forth below.

The singular forms "a", "an", and "the" include plural referents unless the context clearly dictates otherwise.

The terms comprising, including, containing and various forms of these terms are synonymous with each other and are meant to be equally broad.

The term "depositing," as used herein, refers to any suitable application technique, which may be manual or automated. Generally, depositing may be performed using vapor deposition techniques, coating techniques, grafting techniques, or the like. Some specific examples include chemical vapor deposition (CVD), spray coating, spin coating, dunk or dip coating, puddle dispensing, or the like.

As used herein, the term "depression" refers to a discrete concave feature in a patterned wafer having a surface opening that is completely surrounded by interstitial region(s) of the patterned wafer surface. Depressions can have any of a variety of shapes at their opening in a surface including, as examples, round, elliptical, square, polygonal, star shaped (with any number of vertices), etc. The cross-section of a depression taken orthogonally with the surface can be curved, square, polygonal, hyperbolic, conical, angular, etc. As examples, the depression can be a well or a flow channel.

As used herein, the term "hard baking" or "hard bake" refers to incubating or dehydrating a polymer formulation to drive out the solvent(s), where the duration of the process usually lasts from about 5 seconds to about 10 minutes at a temperature ranging from about 100° C. to about 300° C. Non-limiting examples of the devices that can be used for hard baking include hot plates.

As used herein, the term "feature" or "nanofeature" is intended to mean a discrete physical element or discrete physical trait of a substrate. A feature/nanofeature includes a distinguishable physical or structural trait of a substrate. Therefore, a feature is a component of a substrate that provides physical separability. A feature separates, e.g., a biopolymer deposited at a first feature from a biopolymer deposited at a second feature.

As used herein, the term "soft baking" or "soft bake" refers to a process of incubating or dehydrating a polymer or hydrogel formulation to drive out the solvent(s), where the duration of the process usually lasts from about 5 seconds to about 10 minutes at a temperature ranging from about 60° C. to about 130° C. Non-limiting examples of the devices that can be used for soft baking include hot plates.

Figure 2A:
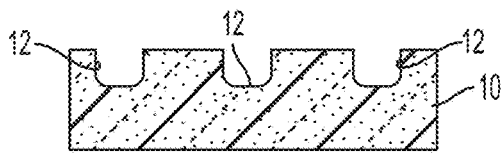

Referring now to FIGS. 1 and 2A-2E together, a plurality of silicon masters, one of which is designated as 10, is disposed on a wafer 11 (e.g., a silicon wafer). It is to be understood that, after the processing described below with regard to FIGS. 2A-2E, a plurality of working stamps 16' may be formed from a single wafer 11. It is to be understood that other materials may be used as the master 10, such as, a metal, such as, for example, nickel. In an example, the master 10 is a silicon oxide master. The master 10 includes a plurality of nanofeatures 12 defined therein (FIG. 2A). It is to be understood that the nanofeatures may be of any suitable shape, size and/or configuration. In an example, the nanofeatures 12 are in the shape of at least substantially cylindrical depressions/wells formed from a single working stamp 16' (see, e.g., FIG. 4, left side).

According to an example of a method as disclosed herein, the master 10 may be cleaned and dried. Then, an anti-stick layer (ASL) formulation, including a solvent and a molecule having a cyclosiloxane with at least one silane functional group, is deposited on the master 10 and on the plurality of nanofeatures 12.

It is to be understood that any suitable solvent may be used. In an example, the solvent is an organic solvent. In an example, the solvent has a boiling point of about 110° C. or less; and in a further example, the solvent has a boiling point of less than about 70° C. In an example, the solvent is selected from the group consisting of tetrahydrofuran (THF) (which has a boiling point of 66° C.) and toluene (which has a boiling point of 110° C.). In other embodiments, the solvent has a boiling point of between about 60° C. and about 150° C.

In an example, the molecule is present in the ASL formulation in an amount of at least about 5 wt %. In another example, the molecule is present in the ASL formulation in an amount ranging from about 5 wt % to about 10 wt %. In still another example, the molecule is present in the ASL formulation in an amount ranging from about 10 wt % to about 20 wt %. It is to be understood that, as used herein, the term "molecule" present in the ASL formulation is intended to include i) the molecule in its neat form; and/or ii) a mixture of the molecule in its neat form with an oligomer(s) of the molecule.

It is to be understood that any suitable depositing method may be used. In an example, the ASL layer formulation is spin coated onto the master 10. In another example, the ASL formulation may be deposited via a chemical vapor deposition (CVD) process. In further examples, the ASL formulation may be deposited via any of spray coating, dunk or dip coating, or puddle dispensing.

Figure 2B:
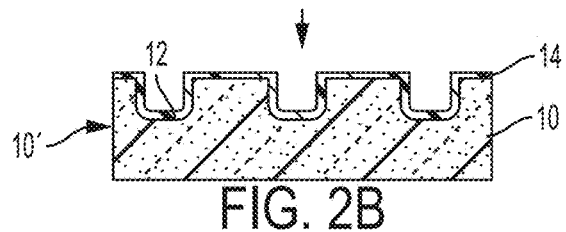

The method may further include curing the ASL formulation, thereby forming an anti-stick layer 14 on the master 10, the anti-stick layer including the molecule (FIG. 2B). In an example, the ASL formulation is thermally cured. In some examples, the thermal curing may be performed at a temperature ranging from about 60° C. to about 220° C. While an example range has been provided, it is to be understood that the thermal curing temperature may be higher or lower, depending upon the system and/or solvent being used. As examples, the temperature range may be from about 40° C. to about 60° C., or from about 220° C. to about 240° C.

The master 10 having the anti-stick layer 14 thereon is a master template, designated generally at 10' in FIG. 2B. The master template 10' may then be washed with a solvent. The washing step serves to remove excess and/or unreacted materials.

Examples of the anti-stick layer 14 include a molecule having a cyclosiloxane with at least one silane functional group. In an example, the molecule is:

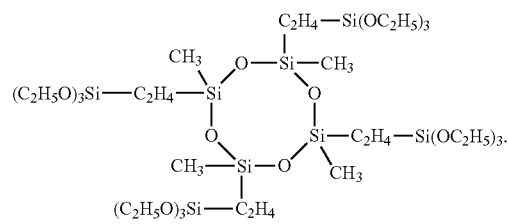

In an example, the ASL formulation (from which the anti-stick layer 14 is formed after deposition and curing) includes a mixture of the molecule in its neat form and an oligomer (e.g., dimers and trimers) of the molecule, i.e., the ASL formulation/the starting ASL material may not only be composed of small molecules, but rather, it may be a mixture of small molecules and oligomers of the molecule. After the ASL curing step on the master, the ratio of neat (small molecule) to oligomer may be affected in the favor of the oligomeric species. Polymerization of the ASL molecule may be triggered thermally. Without being bound by any theory, it is believed that the mixture of neat molecules with oligomeric molecules (larger molecules) may better cover a large portion of the surface, and the smaller molecules may react in the small gap(s) left uncovered by the oligomeric molecules. However, it is to be understood that, in further examples, the ASL formulation may contain neat molecules without oligomeric molecules.

In an example, the ASL formulation includes an amount of oligomer ranging from about 0 wt % to about 35 wt %, and includes an amount of neat compound ranging from about 100 wt % to about 65 wt %. In another example, the ASL formulation includes an amount of oligomer ranging from about 20 wt % to about 30 wt %, and includes an amount of neat compound ranging from about 80 wt % to about 70 wt %. In still another example, the ASL formulation includes an amount of oligomer ranging from about 20 wt % to about 23 wt %, and includes an amount of neat compound ranging from about 80 wt % to about 77 wt %. In yet a further example, the ASL formulation is 100 wt % neat compound. It is believed that regardless of the ASL formulation composition (i.e., wt % of the neat versus oligomer), the performance of the ASL material will be at least substantially unchanged.

In an example using a mixture of neat compound and oligomeric compound (i.e., not 100 wt % neat compound), the molecule is present in the ASL formulation in an amount of about 5 wt %. In an example using 100 wt % neat compound, the molecule is present in the ASL formulation in an amount of about 10 wt %.

In one non-limiting example, the present inventors have found that the molecule being present in the ASL formulation in an amount of about 5 wt % for the neat/oligomeric mix and at about 10 wt % for the neat material were generally the lowest concentrations at which consistent working stamps 16' may be made and were successful at imprinting (desirable level of pattern fidelity and low/controlled roughness (discussed further below)). In this example, the results indicate that an acceptable ASL uniformity is achieved for the 5/10 wt % formulations, thereby resulting in smoother imprinted surfaces. In comparison, a lower concentration may generate a "patchy" coating and result in increased roughness. In some examples, weight percentages greater than 5 wt % for the neat/oligomeric mix and weight percentages greater than 10 wt % for the neat material are used. However, as previously mentioned, a lower concentration may generate undesirable results.

The number average and weight average molecular weight of the molecule having the cyclosiloxane with at least one silane functional group may vary, depending in part on the percentage of neat compound and/or oligomer present. As examples, the number average molecular weight ranges from about 1280 to about 1600 and/or the weight average molecular weight ranges from about 1800 to about 3700. Molecular weight determinations may be made by gel permeation chromatography (GPC) and/or NMR.

It is to be understood that any suitable cyclosiloxanes may be used. In an example, the cyclosiloxane is selected from the group consisting of cyclotetrasiloxane, and cyclohexasiloxane. It is to be further understood that a wide range of cyclosiloxanes of various ring sizes are contemplated as being suitable for examples of the ASL formulation, e.g., from 4 to 24 repeat units (—[$H_2SiO$]$_n$—) (the most common ones are 6 and 8 membered rings). The ring size is a repetition of the Si—O motif and should be an even number. As the ring size gets bigger, a mixture of rings with different sizes may predominate, but this is also contemplated as being suitable for examples of the ASL formulation.

In an example, the silane functional group(s) of the cyclosiloxane molecule is an alkyl alkoxysilane. In further examples, the spacer in between the cyclosiloxane and the alkoxy or ethoxy silane group could include various chemical groups such as amino groups, double or triple bonds, ester groups, polyethylene glycol units, etc. In yet a further example, the alkyl alkoxysilane is ethyl triethoxysilane.

It is to be understood that the length of the spacer should not affect the affinity for the alkoxysilane to bond to the master 10. The most common spacer lengths are between a C2 and a C12 chain. In some examples, the alkoxysilane group is a tri- or mono-methoxysilane or a tri- or mono-ethoxysilane, or, in other examples, a tri-, di- or mono-chlorosilane may be used. In some examples, the alkoxysilane group is a dialkyl-alkoxysilane, where the alkyl groups are C1-6alkyl groups, such as methyl or ethyl groups. However, the end group is not a methyl silane or an ethyl silane, as it needs to contain a chemical group which can react with the master 10 surface.

In a further example, the ASL molecule excludes fluorine. It has been found that the ASL molecules disclosed herein that exclude fluorine have a suitable surface energy for, and result in efficient wetting of working stamp materials other than fluorinated compounds (e.g., a silicon-based material 16).

Figure 2C:
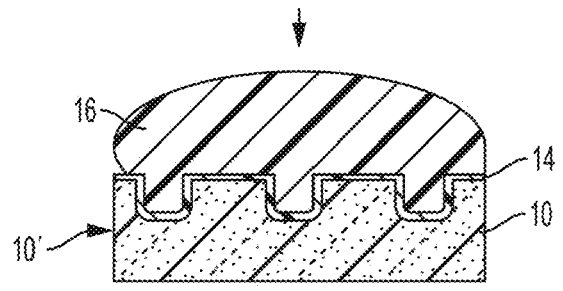
Figure 2D:
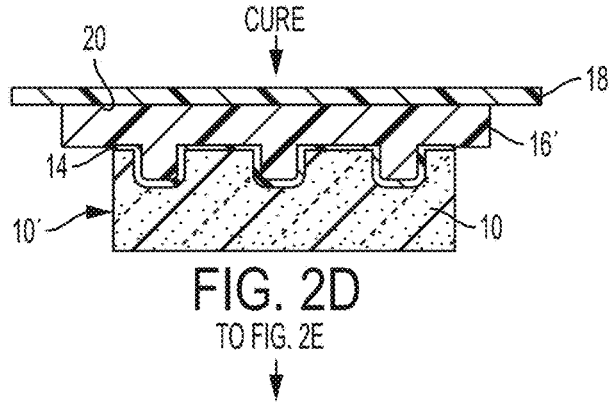

An example of the method further includes depositing a silicon-based material 16 (for forming a working stamp) on the anti-stick layer 14 of the master template 10' (FIG. 2C). By "silicon-based" material as used herein, it is meant that the material is composed of at least about 50 mol % of silicon containing molecules (repeating monomer units). In an example, the silicon-based WS material 16 is composed of about 100 mol % of silicon containing molecules (repeating monomer units). In a further example, the WS material 16 may be a "silicon-containing polymer" (i.e., a polymer having less than about 50 mol % of silicon containing molecules). In other examples, the WS material comprises silicone acrylate. In other examples, the WS material also comprises at least one photoinitiator.

It is to be understood that any suitable deposition method may be used. Examples of suitable deposition techniques include spray coating, spin coating, dunk or dip coating, puddle dispensing, etc. In an example, the silicon-based material 16 is spin coated onto the master template 10'.

The method further includes curing the silicon-based material 16, thereby forming a working stamp 16' including a negative replica of the plurality of nanofeatures 12 (FIG. 2D), in contact with the anti-stick layer 14 on the silicon master 10. In an example, the working stamp material 16 is cured via ultraviolet (UV) radiation. In another example, the WS material 16 is thermally cured. In some examples, the thermal curing may be performed at a temperature ranging from about 60° C. to about 300° C. As used herein, the term "contact" may encompass physical contact between components.

The method may further include attaching a backplane to the working stamp 16'. In an example, a polymer film including an adhesive material 20 may be applied (e.g., by roll coating) to the working stamp material 16 (prior to curing) such that the adhesive contacts the working stamp material 16. Then when exposed to UV radiation, both the working stamp material 16 and the adhesive material 20 will cure, thereby adhering the working stamp 16' to the backplane 18. It is to be understood that the backplane 18 may be formed from any suitable polymeric material. In an example, the backplane 18 is a polyethylene terephthalate (PET) film. Other examples of the backplane 18 include poly(vinyl chloride) (PVC) and propylene oxide (PO). In some aspects, the backplane material is flexible. It is to be further understood that the adhesive material may be any suitable UV curable material.

The method further includes releasing the working stamp 16' from the master template 10'. It is to be understood that the releasing may be by any suitable means. In an example, the releasing is by unrolling/peeling the cured working stamp 16' from the master template 10'.

It is to be understood that the working stamp (WS) material 16 may be any material that meets the following specifications. The WS material 16 should be stable and able to be coated/formed on the master template 10'. By stable, it is meant that once fabricated, the WS 16' should remain unchanged (no degradation) until its end of use (life cycle). The WS 16' should support room temperature storage for at least one month after fabrication and repeated UV exposure (e.g., imprinting processes). The repeat of UV exposure should not change the toughness/softness of the WS 16' by increasing the cross-linking density. The resulting WS 16' should be soft/flexible, but yet should also exhibit adequate mechanical properties. For example, the WS 16' should be soft enough to support rolling on the resin during the imprinting process (but not fully rolling around a cylinder) and peeling off after resin cure; but should not be stretchable so that it can maintain well dimension and pattern fidelity between imprints. For example, the WS 16' should be resistant to deformation, and resistant to fracture/rupture. As an example, the WS 16' should show no deformation at all to produce consistent feature dimensions. Further, the WS surface 22 should have a desirable level of anti-sticking surface properties (e.g., relative to the resin to be imprinted); the WS 16' should be chemically stable (as described above in terms of stability); and the WS 16' should be resistant to large degrees of swelling. In term of surface properties, the cured WS 16' should have appropriate surface tension to offer successful removal of the WS 16' from the imprinted surface. The resistance to swelling is specific to the solvent used for the working stamp material 16 as well as the resin formulation. The WS 16' should not swell at either the WS fabrication step or the imprinting step. Swelling may result in feature size or dimension changes.

In an example, the silicon-based working stamp 16' is made from polymerized silicon acrylate monomers (i.e., 100 mol % of silicon containing molecules, made of a single monomer: it is a homopolymer). This may prevent inhomogeneity of the final polymer (e.g., a copolymer may result in phase segregation, gradient in the polymer chain).

In a further example, the released working stamp 16' is at least substantially free (i.e., free or substantially free) of the ASL molecule. Without being bound by any theory, it is believed that no transfer of the ASL molecule should occur during the WS 16' fabrication process (i.e., free of the ASL molecule), as any excess of unreacted ASL molecule should have been washed away before fabrication of the first WS 16'. If any of the molecule does transfer, it is believed that it would be at the parts per million (ppm) level at most, and thus the WS 16' would be substantially free of the ASL molecule.

The present inventors have found that selection of the ASL and WS materials is important for effective WS fabrication. A suitable surface energy match should exist between the ASL-coated master (master template 10') and the working stamp material 16. This should then offer both suitable surface wettability and effective stamp detachment. Stamp robustness/integrity through imprint should also be obtained by selection of a WS material meeting the specifications set forth above.

The examples of the ASL materials 14 disclosed herein allow the use of a silicon-based WS material in an automated process, with systematic efficient wetting, smooth WS 16' detachment from the master template 10', and high quality imprint (a desirable level of pattern fidelity and low surface roughness), using a nano-imprint lithography (NIL) process. It is to be understood that suitable wetting and stamp release do not always lead to desirable imprint quality. As such, the examples of the ASL materials disclosed herein are tested (if successful through WS 16' fabrication), and are validated with an imprint testing plan.

According to examples of the present disclosure, both polymeric compounds and small molecules may be considered for the ASL material 14.

It is to be understood that the ASL material 14 may be any material that meets the following specifications. The ASL material 14 should be a compound that is thermally stable (to survive baking). The ASL material 14 should also be a compound that is UV stable (e.g., to survive repeated WS 16' fabrication processes). The ASL material 14 coated on the silicon master should survive at least about 1 month after being coated at room temperature (e.g., the temperature within the instrument) and support repeated UV exposure (i.e., the WS 16' fabrication process). The ASL material should exhibit a static contact angle above about 80° (using water). In an example, the static contact angle ranges from about 80° to about 110° (using water). Further, in an example, there exists a surface energy match between the ASL-coated master template 10' and the working stamp material 16. As used herein, a surface energy may be considered to "match" when the static contact angle (using water) of the ASL material 14 is within about +/−10 degrees of the static contact angle (using water) of the WS material 16. A suitable surface energy match may be achieved, for example, when the ASL-coated master template 10' has an average contact angle of about 90° (using water) and the working stamp material 16 has an average contact angle ranging from about 95° to about 100° (using water). The contact angles disclosed herein are measurements/values collected from a continuous surface, and not from a patterned area.

Referring now to FIGS. 3A-3E, an example of a method of using an example of the working stamp 16' is illustrated.

A substrate/support 24 is provided, as shown in FIG. 3A. In an example, the substrate 24 is glass. However, it is to be understood that any suitable substrate may be used.

For example, some suitable substrate 24 examples include silica based substrates, such as glass, fused silica and other silica-containing materials. In some examples, silicon-based substrates may also be chosen from silicon, modified silicon, silicon dioxide, silicon nitride, and silicon hydrides. It is to be understood that in other examples, the substrate 24 material may be chosen from plastic/polymeric materials, e.g., acrylics, polyethylene, polystyrene and copolymers of styrene and other materials, poly(vinyl chloride), polypropylene, polybutylene, nylons, polyesters, polycarbonates, and poly(methyl methacrylate), polyurethanes, polytetrafluoroethylene (PTFE) (such as TEFLON® from Chemours), cyclic olefins/cyclo-olefin polymers (COP) or copolymers (COC) (such as ZEONOR® from Zeon), polyimides, etc.). In an example, the polymeric substrate material is chosen from poly(methyl methacrylate), polystyrene, and cyclic olefin polymer substrates. In a further example, the substrate 24 has at least one surface that is glass, modified glass, or functionalized glass. Still other suitable substrate materials include ceramics, carbon, inorganic glasses, and optical fiber bundles. While several examples have been provided, it is to be understood that any other suitable substrate/support may be used.

In some other examples, the substrates may be a metal. In an example, the metal is gold. In some examples, the substrate 24 has at least one surface that is a metal oxide. In one example, the surface is a tantalum oxide or titanium oxide. It is to be understood that acrylamide, enone (α,β-unsaturated carbonyl), or acrylate may also be used as a substrate material. Other substrate materials may include gallium arsenide (GaAs), indium tin oxide (ITO), indium phosphide, aluminum, ceramics, polyimide, quartz, resins, aryl azide, polymers and copolymers.

In some examples, the substrate 24 and/or the substrate surface S may be quartz. In some other examples, the substrate 24 and/or the substrate surface S may be a semiconductor, e.g., gallium arsenide (GaAs) or indium tin oxide (ITO).

Example substrates may include a single material or a plurality of different materials. In a further example, substrates may be composites or laminates. In yet a further example, substrates may be flat and round.

The example method of using WS 16' may further include depositing an adhesion/prime layer 26 on the surface S of the substrate/support 24, as shown in FIG. 3B. Suitable compounds for the adhesion/prime layer 26 should have two functional groups: one to react with the substrate surface S and one to react with an imprint lithography resin 28. The group reacting with the surface S can be, for example, an alkoxysilane group, such as a tri or mono methoxysilane or a tri or mono ethoxysilane; or a tri, di or mono chlorosilane; or a dialkyl-alkoxysilane group. The group reacting with the resin 28 can be, for example, an epoxy group, amino group, hydroxyl group or a carboxylic acid group. The skeleton of the molecule linking the 2 reactive groups can be of any nature.

The example method of using WS 16' includes depositing an imprint lithography resin (e.g., a photocurable (when using UV curing) nano-imprint lithography (NIL) polymeric resin) 28 onto the support 24 (FIG. 3C). After soft baking the resin 28 to remove excess solvent, WS 16' is pressed against the layer of resin 28 to create an imprint on the resin 28 such that resin layer 28 is indented or perforated by the teeth of the WS 16' (FIG. 3D). The method still further includes curing the resin 28 (e.g., by exposing the resin 28 to ultraviolet (UV) radiation). In another example, thermal curing may be used. For a thermally driven curing process, the temperature can be as high as 550° C. and the force applied to the resin 28 (from the WS 16') can be as high as 360 kN. For the soft materials disclosed herein, lower temperature and pressure may be used.

Figure 4:
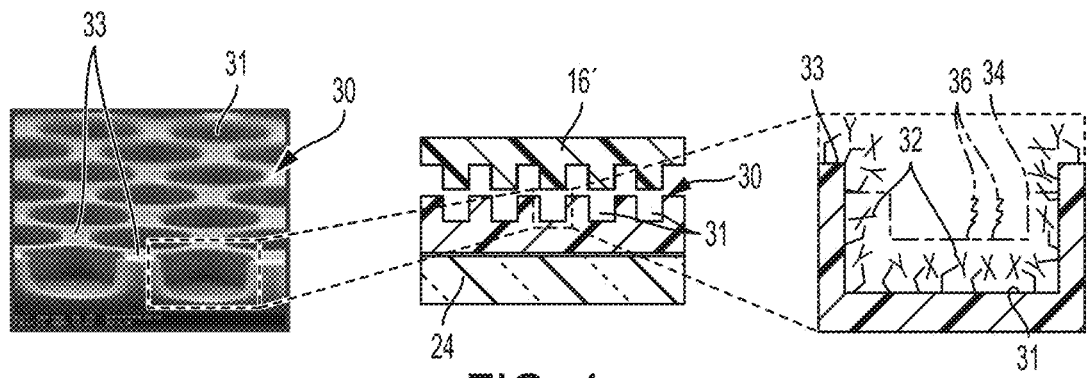
FIG. 4 shows, on the left, a scanning electron microscope (SEM) image of a cutaway, partially cross-sectioned imprinted substrate surface (illustrated in the middle), and on the right, a further enlarged depiction of a single well with a plurality of surface functional groups.

After curing, working stamp 16' is released, thereby forming a patterned sequencing surface 30 (including chemical functionality 32, or to which chemical functionality 32 is added in a subsequent step, see FIG. 4) having a replication of the plurality of master 10 nanofeatures 12 therein (FIG. 3E), defining wells/depressions 31. As used herein, the term "sequencing surface" refers to a surface that can support genetic sequencing surface chemistry (e.g., the intermediate structure 34 and amplification primers 36).

The substrate 24 having the patterned sequencing surface 30 thereon may be subject to further heat curing/hard baking to complete the UV cure and to lock in the imprinted topography. In some examples, the heat curing/hard baking may be performed at a temperature ranging from about 60° C. to about 300° C.

In some examples, the functional groups (X, Y) of the chemical functionality 32 (FIG. 4) are within the well surface of the flow cell and/or are within the interstitial area in contact with the flow cell channel lumen. The functional groups (X, Y) may be available for further functionalization to capture single stranded DNA (ssDNA), if required, for DNA sequencing procedures. This functionalization process may or may not include the selective capture of a polymeric support (e.g., PAZAM, discussed further below) to the flow cell well surface 30. The functional groups (X, Y) may also or alternately act as an anchor point for further modification.

In an example, the sequencing surface 30 is at least substantially free (i.e., free or substantially free) of the ASL molecule (e.g., as stated above with regard to the working stamp 16', none of the ASL molecule is on the sequencing surface 30 (free of the ASL molecule), or if any of the molecule does transfer, it is believed that it would be at the parts per million (ppm) level at most. Moreover, the sequencing surface 30 with the genetic sequencing surface chemistry thereon is also at least substantially free of the ASL molecule.

In an example of a method for using the sequencing surface 30, an intermediate structure 34 is deposited into the wells 31. The wells 31 may be micro wells (having at least one dimension on the micron scale, e.g., about 1 μm to about 1000 μm) or nanowells (having at least one dimension on the nanoscale, e.g., about 1 nm to about 1000 nm). Each well 31 may be characterized by its volume, well opening area, depth, and/or diameter.

Each well 31 can have any volume that is capable of confining a liquid. The minimum or maximum volume can be selected, for example, to accommodate the throughput (e.g., multiplexity), resolution, analyte composition, or analyte reactivity expected for downstream uses of the sequencing surface 30. For example, the volume can be at least about $1\times10^{-3}$ μm$^3$, about $1\times10^2$ μm$^3$, about 0.1 μm$^3$, about 1 μm$^3$, about 10 μm$^3$, about 100 μm$^3$, or more. Alternatively or additionally, the volume can be at most about $1\times10^4$ μm$^3$, about $1\times10^3$ μm$^3$, about 100 μm$^3$, about 10 μm$^3$, about 1 μm$^3$, about 0.1 μm$^3$, or less. It is to be understood that the intermediate structure 34 can fill all or part of the volume of a well 31. The volume of the intermediate structure 34 in an individual well 31 can be greater than, less than or between the values specified above.

The area occupied by each well opening on a surface can be selected based upon similar criteria as those set forth above for well volume. For example, the area for each well opening on a surface can be at least about $1\times10^{-3}$ μm$^2$, about $1\times10^2$ μm$^2$, about 0.1 μm$^2$, about 1 μm$^2$, about 10 μm$^2$, about 100 μm$^2$, or more. Alternatively or additionally, the area can be at most about $1\times10^3$ μm$^2$, about 100 μm$^2$, about 10 μm$^2$, about 1 μm$^2$, about 0.1 μm$^2$, about $1\times10^2$ μm$^2$, or less.

The depth of each well 31 can be at least about 0.1 μm, about 1 μm, about 10 μm, about 100 μm, or more. Alternatively or additionally, the depth can be at most about 1×10³ μm, about 100 μm, about 10 μm, about 1 μm, about 0.1 μm, or less.

In some instances, the diameter of each well 31 can be at least about 50 nm, about 0.1 μm, about 0.5 μm, about 1 μm, about 10 μm, about 100 μm, or more. Alternatively or additionally, the diameter can be at most about 1×10³ μm, about 100 μm, about 10 μm, about 1 μm, about 0.5 μm, about 0.1 μm, about 50 nm, or less.

In the sequencing surface 30, the intermediate structure 34 is positioned in each of the discrete wells 31. Positioning the intermediate structure 34 in each well 31 may be accomplished by first coating the patterned surface 30 with the intermediate structure 34, and then removing the intermediate structure 34, for example via chemical or mechanical polishing, from at least the interstitial regions 33 on the surface 30 between the wells 31. These processes retain at least some of the intermediate structure 34 in the wells 31 but remove or inactivate at least substantially all of the intermediate structure 34 from the interstitial regions 33 on the surface 30 between the wells 31. As such, these processes create gel pads 34 (FIG. 4) used for sequencing that can be stable over sequencing runs with a large number of cycles.

Particularly useful intermediate structures 34 will conform to the shape of the site where it resides. Some useful intermediate structures 34 can both (a) conform to the shape of the site (e.g., well 31 or other concave feature) where it resides and (b) have a volume that does not at least substantially exceed the volume of the site where it resides.

In an example, the intermediate structure is a polymer/gel coating. One example of a suitable gel material for the intermediate structure 34 includes a polymer with a recurring unit of Formula (I):

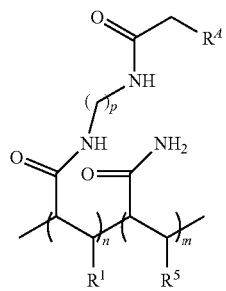

(I)

wherein:
  R¹ is H or optionally substituted alkyl;
  R⁴ is selected from the group consisting of azido, optionally substituted amino, optionally substituted alkenyl, optionally substituted hydrazone, optionally substituted hydrazine, carboxyl, hydroxy, optionally substituted tetrazole, optionally substituted tetrazine, nitrile oxide, nitrone, and thiol;
  R⁵ is selected from the group consisting of H and optionally substituted alkyl;
  each of the —(CH₂)ₚ— can be optionally substituted;
  p is an integer in the range of 1 to 50;
  n is an integer in the range of 1 to 50,000; and
  m is an integer in the range of 1 to 100,000.
Suitable polymers as Formula (I) are described, for example, in U.S. Patent Publication Nos. 2014/0079923 A1, or 2015/0005447 A1, each of which is incorporated herein by reference in its entirety). In the structure of Formula (I), one of ordinary skill in the art will understand that the "n" and "m" subunits are recurring subunits that are present in a random order throughout the polymer.

A particular example of a polymer coating such as Formula (I) is poly(N-(5-azidoacetamidylpentyl)acrylamide-co-acrylamide (PAZAM), described, for example, in U.S. Patent Publication Nos. 2014/0079923 A1, or 2015/0005447 A1, which comprises the structure shown below:

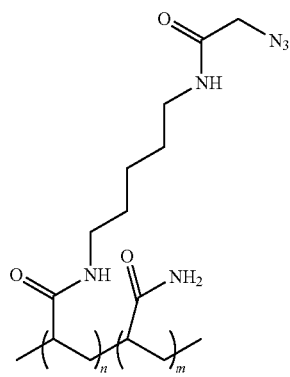

wherein n is an integer in the range of 1-20,000, and m is an integer in the range of 1-100,000. As with Formula (I), one of ordinary skill in the art will recognize that the "n" and "m" subunits are recurring units that are present in random order throughout the polymer structure.

The molecular weight of the Formula (I) polymer or PAZAM polymer may range from about 10 kDa to 1500 kD, or may be, in a specific example, about 312 kDa.

In some examples, the Formula (I) or PAZAM polymer is a linear polymer. In some other examples, the Formula (I) or PAZAM polymer is a lightly cross-linked polymer. In other examples, the Formula (I) or PAZAM polymer comprises branching.

Other examples of suitable gel materials for intermediate structure 34 include those having a colloidal structure, such as agarose; or a polymer mesh structure, such as gelatin; or a cross-linked polymer structure, such as polyacrylamide polymers and copolymers, silane free acrylamide (SFA, see, for example, U.S. Patent Publication No. 2011/0059865, which is incorporated herein by reference in its entirety), or an azidolyzed version of SFA. Examples of suitable polyacrylamide polymers may be formed from acrylamide and an acrylic acid or an acrylic acid containing a vinyl group as described, for example, in WO 2000/031148 (incorporated herein by reference in its entirety) or from monomers that form [2+2] photo-cycloaddition reactions, for example, as described in WO 2001/001143 or WO 2003/0014392 (each of which is incorporated herein by reference in its entirety). Other suitable polymers are co-polymers of SFA and SFA derivatized with a bronco-acetamide group (e.g., BRAPA), or co-polymers of SFA and SFA derivatized with an azido-acetamide group.

The intermediate structure 34 may be a preformed gel material. Preformed gel materials may be coated using spin coating, or dipping, or flow of the gel under positive or negative pressure, or techniques set forth in U.S. Pat. No. 9,012,022, which is incorporated herein by reference in its entirety. Dipping or dip coating may be a selective deposition technique, depending upon the surface 30 and the intermediate structure 34 that are used. As an example, the surface 30 is dipped into a preformed gel material 34, and the gel material 34 may fill or coat or deposit into the wells 31 selectively (i.e., the gel material 34 does not deposit on the interstitial regions 33), and polishing (or another removal process) may not be necessary.

Preformed polymer or PAZAM may be coated on the surface 30 using, for example, spin coating, or dipping, or flow of the gel under positive or negative pressure, or techniques set forth in U.S. Pat. No. 9,012,022. The attachment of the polymer or PAZAM may also take place via a surface initiated atom transfer radical polymerization (SI-ATRP) to a silanized surface. In this example, the surface 30 may be pre-treated with APTS (methoxy or ethyoxy silane) to covalently link silicon to one or more oxygen atoms on the surface (without intending to be held by mechanism, each silicon may bond to one, two or three oxygen atoms). This chemically treated surface is baked to form an amine group monolayer. The amine groups are then reacted with Sulfo-HSAB to form an azido derivative. UV activation at 21° C. with 1 $J/cm^2$ to 30 $J/cm^2$ of energy generates an active nitrene species, which can readily undergo a variety of insertion reactions with the PAZAM.

Other examples for coating the polymer or PAZAM on the surface 30 are described in U.S. Patent Publication No. 2014/0200158, which is incorporated herein by reference in its entirety), and include ultraviolet (UV) mediated linking of PAZAM monomers to an amine-functionalized surface, or a thermal linkage reaction involving an active group (acryloyl chloride or other alkene or alkyne-containing molecule) with subsequent deposition of PAZAM and application of heat. In some examples, the surface 30 is modified with alkenyl or cycloalkenyl groups, which can then react with azido-functionalized polymers such as PAZAM or those comprising azido-derivatized SPA, under conditions such as click chemistry, to form covalent bonds between the modified surface and the polymer.

The intermediate structure 34 may be a liquid that subsequently forms the gel material 34. An example of applying liquid that subsequently forms the gel material 34 is the coating of an array of wells 31 with silane free acrylamide and N-[5-(2-bromoacetyl) aminopentyl]acrylamide (BRAPA) in liquid form and allowing the reagents to form a gel by polymerization on the surface. Coating of an array in this way can use chemical reagents and procedures as set forth in U.S. Patent Publication No. 2011/0059865.

The intermediate structure 34 may be covalently linked to the surface 30 (at the wells 31) or may not be covalently linked to the surface 30. The covalent linking of the polymer to the wells 31 is helpful for maintaining the intermediate structure 34 in the wells 31 throughout the lifetime of the surface 30 during a variety of uses. However, as noted above and in many examples, the intermediate structure 34 need not be covalently linked to the wells 31. For example, silane free acrylamide, SFA, is not covalently attached to any part of the surface 30.

In the example of a method for using the surface 30, amplification primers 36 may be grafted via any suitable method onto the intermediate structure 34 present in the wells 31 (i.e., in the replication of the plurality of nanofeatures 12). In some examples, the amplification primers comprise functional groups (such as alkynyl groups or thiophosphate groups) that are capable of reacting with functional groups in the intermediate structure 34 (such as azido groups) to form covalent bonds.

To further illustrate the present disclosure, examples are given herein. It is to be understood that these examples are provided for illustrative purposes and are not to be construed as limiting the scope of the present disclosure.

EXAMPLES

Example 1

D4-Tetra-ethyl triethoxysilane was used as an example ASL material. D4-tetra-ethyl triethoxysilane is an octamethylcyclotetrasiloxane in which one methyl group at each silicon position is replaced with a (triethoxysilyl)ethyl-group. A fluorinated polymeric material was used as a comparative ASL material. The example ASL material was incorporated into a formulation containing about 5 wt % of the material in tetrahydrofuran (THF).

Silicon masters, each of which included a plurality of nano-sized features defined therein, were respectively coated with the ASL material and the comparative ASL material. The ASL material and the comparative ASL material were thermally cured and solvent washed.

The same type of working stamp resin, formed of silicon acrylate monomers, was spin coated on each of the coated silicon masters, and exposed to ultraviolet (UV curing) to form working stamps and comparative working stamps. After one working stamp (first generation) or comparative working stamp was generated, the working stamp or comparative working stamp was released from the respective coated silicon master, and the coated silicon masters were used again to generate additional working stamps and comparative working stamps (second generation, third generation, fourth generation, fifth generation, etc.).

Figure 5:
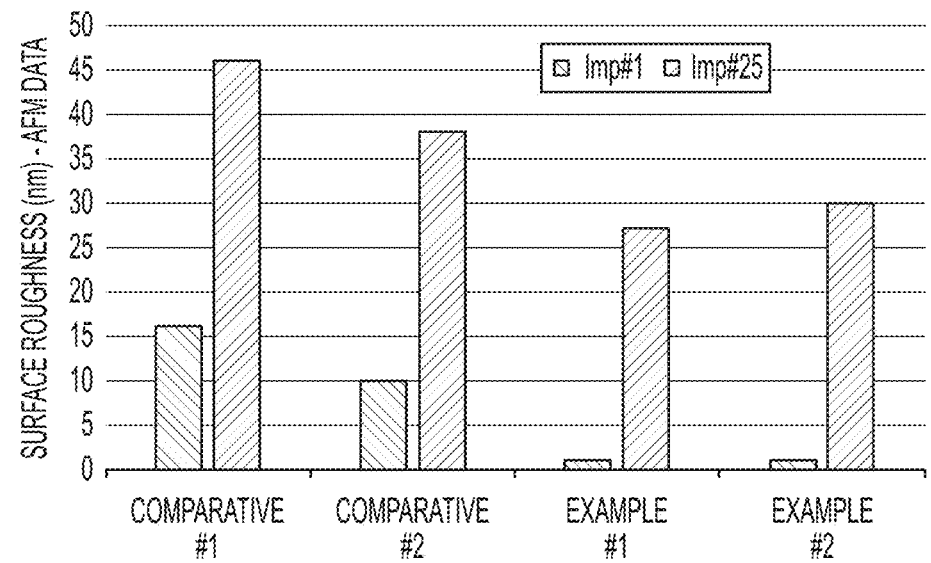
FIG. 5 is a bar graph illustrating, in one example, surface roughness between the first imprint and the last imprint, using the first and fifth working stamps produced from a master coated with a comparative anti-stick layer (two sets of bars on the left), compared to the first and fifth working stamps produced from a master coated with an example anti-stick layer (two sets of bars on the right)

The working stamps and comparative working stamps were used in nanoimprint lithography (NIL) testing. Each working stamp was used to imprint (via NIL) 25 different samples, and each comparative working stamp was used to imprint (via NIL) 25 different comparative samples. The first imprint (Imp #1) and the 25th imprint (Imp #25) generated using each of the first generation working stamps (Example #1) and the fifth generation working stamps (Example #2) were exposed to atomic force microscopy (AFM) to determine the surface roughness. The first imprint (Imp #1) and the 25th imprint (Imp #25) generated using each of the first generation comparative working stamps (Comparative #1) and the fifth generation comparative working stamps (Comparative #2) were also exposed to AFM to determine the surface roughness. These results are shown in FIG. 5. As depicted, the surface roughness was lower for each of the imprints formed with the example working stamps (i.e., formed from the silicon master coated with the ASL material) compared to the imprints formed with the comparative example working stamps (i.e., formed from the silicon master coated with the comparative ASL material). In some examples, surface roughness of the imprints generated from a working stamp as described herein is less than 100 nm (using the testing methods described herein), or less than 80 nm, or less than 60 nm, or less than 50 nm, or less than 40 nm, or less than 30 nm.

Figure 7A:
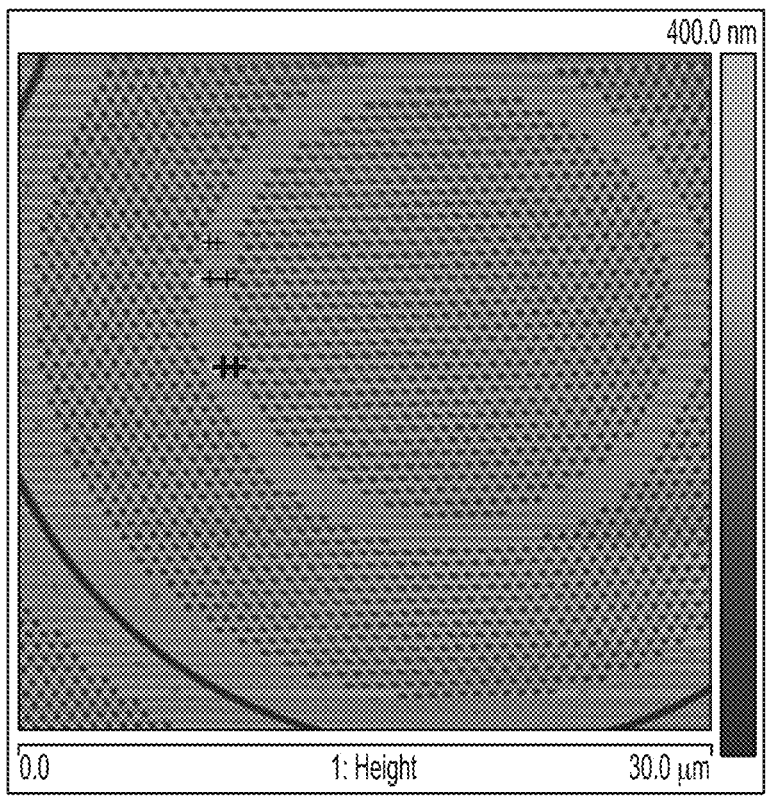
FIG. 7A is a 30 µm atomic-force microscopy (AFM) image of a top view of an example imprinted substrate surface formed from the 25th imprint produced from the 5th generation of a working stamp produced from a master coated with an example anti-stick layer.
Figure 7B:
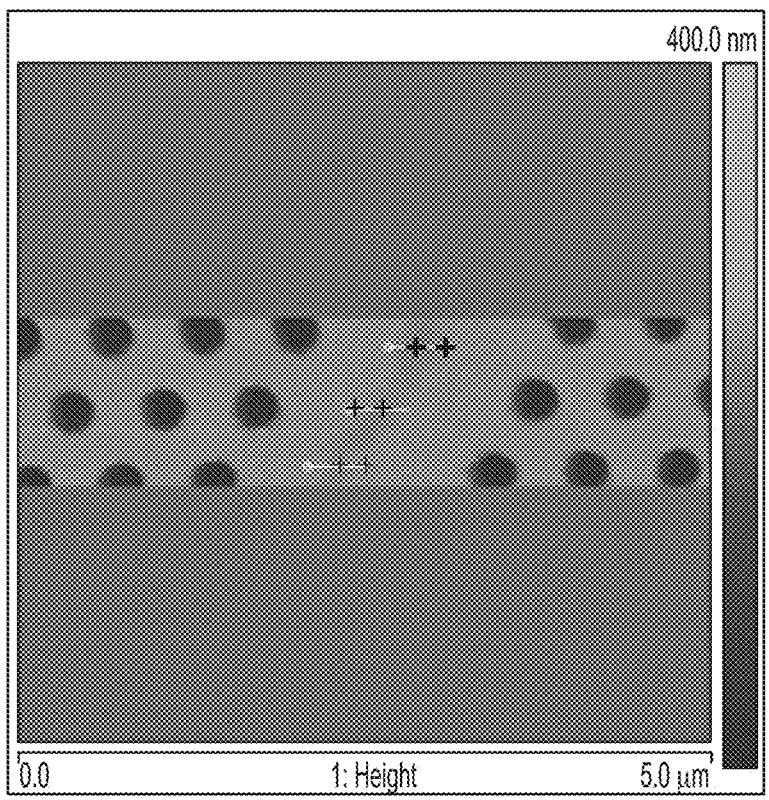
FIG. 7B is a 5 µm atomic-force microscopy (AFM) image of the view of FIG. 7A.

FIGS. 7A and 7B are 30 μm and 5 μm AFM images, respectively, of the 25th imprint (Imp #25) produced from the fifth generation working stamp produced from the silicon master coated with the example ASL material. These images show that round wells and sharp well edges can be created even after the coated silicon master has been used to form several working stamps, and even after the working stamp produced from the coated silicon master has been used for imprinting several times.

The example ASL material was also coated (in a single ASL material deposition) on two silicon masters, A and B. The same type of working stamp resin, formed of silicon acrylate monomers, was spin coated on each of the coated silicon masters A and B, and exposed to ultraviolet (UV curing) to form working stamps. After one working stamp (first generation A or B), the working stamp was released from the respective coated silicon master A or B, and the coated silicon masters A and B were used again to generate additional working stamps (second generation, third generation, fourth generation, fifth generation . . . 50th generation). For the A master, 50 working stamps were generated and tested, and for the B master, 30 working stamps were generated and tested.

The working stamps were used in nanoimprint lithography (NIL) testing. Each working stamp was used to imprint (via NIL) 25 different samples. The first imprint (Ima #1) and the 25th imprint (Ima #25) generated using each of the first generation working stamps (WS #1), fifth generation working stamps (WS #5), 15th generation working stamps (WS #15), 20th generation working stamps (WS #20), 25th generation working stamps (WS #25), 30th generation working stamps (WS #30), 35th generation working stamps (WS #35), 40th generation working stamps (WS #40), 45th generation working stamps (WS #45), and 50th generation working stamps (WS #50) were exposed to AFM to determine the surface roughness.

Figure 6:
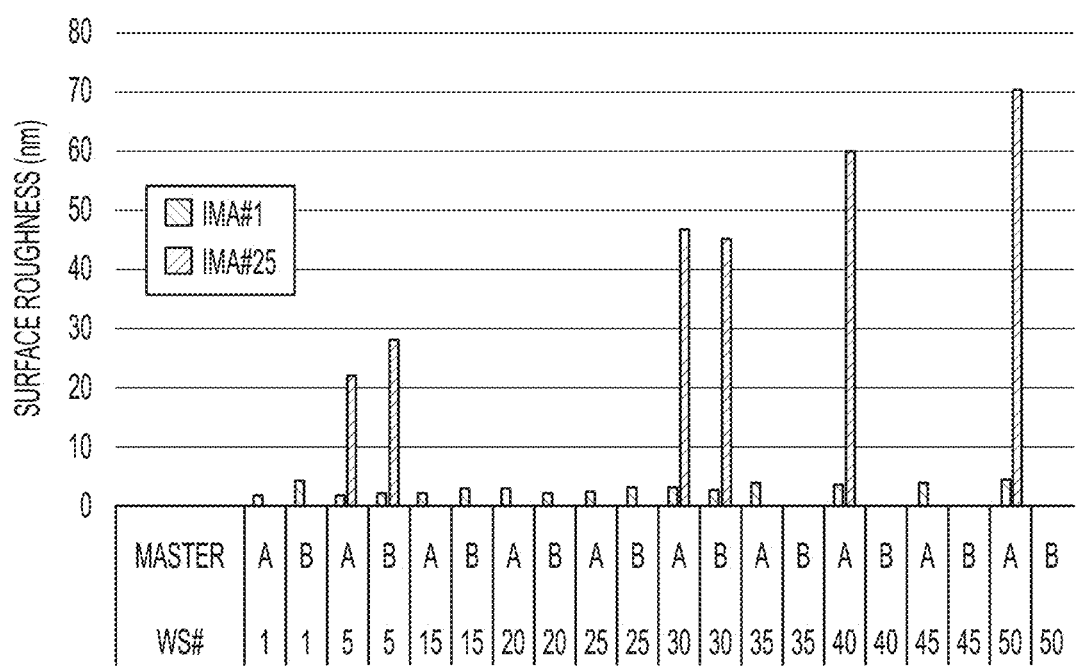
FIG. 6 is a bar graph showing, in one example, surface roughness evolution as a function of working stamp generation and imprint number.

These results are shown in FIG. 6, which depicts the evolution of the imprint surface roughness (for the first and 25th imprints) as a function of working stamp generation. For the first imprints produced, the surface roughness is independent of the working stamp generation used. For later imprints (e.g., Ima #25), the surface roughness increased slightly with the working stamp generation. Using WS #50 formed from either coated silicon master A or B, imprints with low surface roughness (<100 nm) can still be produced. Being able to produce 50 working stamps from one ASL coated master (where the ASL material was coated in a single deposition) and being able to use all 50 to create usable imprints is a significant improvement in process capability (e.g., when compared with a similar process using a fluorinated polymeric material as the ASL material).

Example 2

D4-Tetra-ethyl triethoxysilane was used as an example ASL material. A fluorinated polymeric material was used as a comparative ASL material. The ASL material was incorporated into a formulation containing about 5 wt % of the material in tetrahydrofuran (THF).

Silicon masters, each of which included a plurality of nano-sized features defined therein, were respectively coated with the ASL material and the comparative ASL material. The ASL material and the comparative ASL material were thermally cured and solvent washed. In some examples, the solvent is THF. In other examples, the solvent solubilizes the uncured ASL material.

Different types of working stamp resins were used in this example. One working stamp resin was formed of silicon acrylate monomers. Another working stamp resin was a fluorinated working stamp material. The silicon acrylate working stamp resin was spin coated on the silicon master coated with the ASL material and exposed to UV curing to form at least five generations of working stamps. The fifth generation was used in this example and is referred to as working stamp example #3. The silicon acrylate working stamp resin was also spin coated on the silicon master coated with the comparative ASL material and exposed to UV curing to form at least five generations of comparative working stamps. The fifth generation of these comparative working stamps was used in this example and is referred to as comparative working stamp #3 (comparative example #3). The fluorinated working stamp material was spin coated on the silicon master coated with the comparative ASL material and exposed to UV curing to form at least five generations of additional comparative working stamps. The fifth generation of the additional comparative working stamps was used in this example and is referred to as comparative working stamp #4 (comparative example #4).

Working stamp #3 and comparative working stamps #3 and #4 were used in nanoimprint lithography (NIL) testing. Each working stamp was used to imprint (via NIL) twenty five different samples, and each comparative working stamp was used to imprint (via NIL) twenty five different comparative samples.

After 25 imprints, comparative working stamp #3 (i.e., the $5^{th}$ generation silicon acrylate working stamp resin formed form the silicon master coated with the comparative (i.e., fluorinated) ASL material), scanning electron microscopy (SEM) images (not shown) revealed that there were holes in the bottom of the printed wells. This particular combination of materials also suffered from de-wetting (i.e., the $5^{th}$ generation silicon acrylate working stamp resin was de-wetting from the comparative (i.e., fluorinated) ASL material), and thus cannot be used on an automated tool.

Figure 8B:
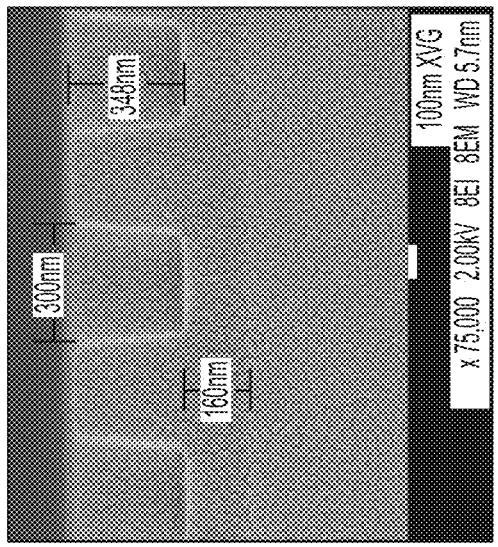
FIG. 8B is a cross-sectional SEM image of the imprinted substrate of FIG. 8A, showing well-defined well cross-sections/sharp well edges.
Figure 9B:
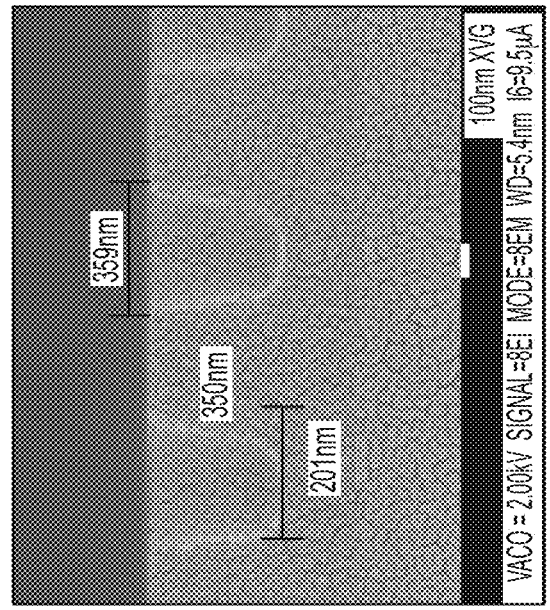
FIG. 9B is a cross-sectional SEM image of the imprinted substrate of FIG. 9A, showing less well-defined well cross-sections and rounded well edges.
Figure 8A:
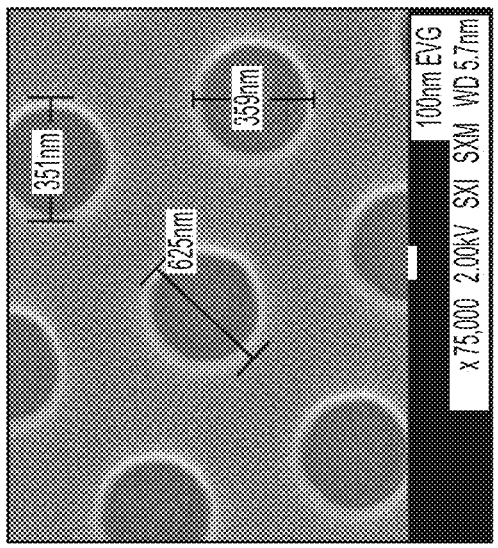
FIG. 8A is a top-down SEM image of an example imprinted substrate surface formed by a working stamp produced from a master coated with an example anti-stick layer, showing a desirable level of pattern fidelity/round wells and no detectable defects.
Figure 9A:
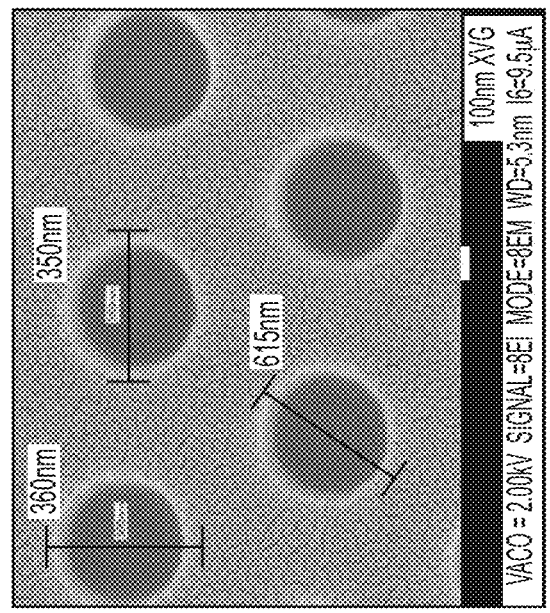
FIG. 9A is a top-down SEM image of an imprinted substrate surface formed by a working stamp produced from a master coated with a comparative anti-stick layer, showing a desirable level of pattern fidelity.

FIGS. 8A and 8B are top-down and cross-section SEM images of the 25th imprint formed from working stamp #3. Imprints formed from the silicon acrylate working stamp resin formed on the silicon master coated with the ASL material show a desirable level of pattern fidelity and sharp, well defined edges. The surface roughness was relatively low R (5 µm)=2 nm and R (30 µm)=3 nm. FIGS. 9A and 9B are top-down and cross-section SEM images of the 25th imprint formed from comparative working stamp #4. Imprints formed from the fluorinated working stamp material formed on the silicon master coated with the comparative ASL material show a desirable level of pattern fidelity, but the wells are rounded and the surface roughness was relatively high R (5 µm)=11 nm and R (30 µm)=12 nm. This data indicates that like materials for the working stamp resin and ASL material (e.g., silicon based working stamp formed on silicon based ASL material or fluorinated working stamp formed on fluorinated ASL material) do not necessarily result in suitable imprints. In fact, comparative working stamp #4 did not produce suitable imprints.

Additional Notes

It should be appreciated that all combinations of the foregoing concepts (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

All publications, patents, and patent applications cited in this Specification are hereby incorporated by reference in their entirety.

Reference throughout the specification to "one example", "another example", "an example", and so forth, means that a particular element (e.g., feature, structure, and/or characteristic) described in connection with the example is included in at least one example described herein, and may or may not be present in other examples. In addition, it is to be understood that the described elements for any example may be combined in any suitable manner in the various examples unless the context clearly dictates otherwise.

It is to be understood that the ranges provided herein include the stated range and any value or sub-range within the stated range. For example, a range from about 5 wt % to about 10 wt %, should be interpreted to include not only the explicitly recited limits of from about 5 wt % to about 10 wt %, but also to include individual values, such as about 5.2 wt %, about 6 wt %, about 7 wt %, etc., and sub-ranges, such as from about 5.5 wt % to about 8 wt %, etc. Furthermore, when "about" and/or "substantially" are/is utilized to describe a value, they are meant to encompass minor variations (up to +/−10%) from the stated value.

While several examples have been described in detail, it is to be understood that the disclosed examples may be modified. Therefore, the foregoing description is to be considered non-limiting.

What is claimed is:

1. An imprinting apparatus, comprising:
   a silicon master including a plurality of nanofeatures defined therein, each of the plurality of nanofeatures having at least one dimension ranging from about 1 nm to about 1000 nm; and
   an anti-stick layer conformally coating the plurality of nanofeatures of the silicon master, the anti-stick layer including a molecule having a cyclosiloxane with at least one silane functional group, wherein the layer consists of a mixture of from about 65 wt % to less than 100 wt % of the molecule in its neat form and from greater than 0 wt % to about 35 wt % of an oligomer of the molecule.

2. The imprinting apparatus as defined in claim 1, wherein the molecule is a cyclotetrasiloxane, a cyclopentasiloxane, or a cyclohexasiloxane, and wherein the molecule is substituted with at least one unsubstituted $C_{1-6}$ alkyl group and with at least one $C_{1-12}$ alkyl group substituted with an alkoxysilane group.

3. The imprinting apparatus as defined in claim 1, wherein the molecule is a cyclotetrasiloxane substituted with four unsubstituted $C_{1-6}$ alkyl groups and four $C_{1-12}$ alkyl groups each substituted with a trialkoxysilane group.

4. The imprinting apparatus as defined in claim 3, wherein the unsubstituted $C_{1-6}$ alkyl groups are methyl groups.

5. The imprinting apparatus as defined in claim 3, wherein the $C_{1-12}$ alkyl groups each substituted with the alkoxysilane group are ethyl or propyl groups.

6. The imprinting apparatus as defined in claim 5, wherein the $C_{1-12}$ alkyl groups each substituted with the alkoxysilane group are ethyl groups.

7. The imprinting apparatus as defined in claim 3, wherein the trialkoxysilane group is a trimethoxysilane or triethoxysilane.

8. The imprinting apparatus as defined in claim 7, wherein the trialkoxysilane group is the triethoxysilane.

9. The imprinting apparatus as defined in claim 1, wherein the cyclosiloxane is selected from the group consisting of cyclotetrasiloxane and cyclohexasiloxane.

10. The imprinting apparatus as defined in claim 9, wherein the silane functional group is an alkyl alkoxysilane.

11. The imprinting apparatus as defined in claim 10, wherein the alkyl alkoxysilane is ethyl triethoxysilane.

12. The imprinting apparatus as defined in claim 1, wherein the molecule is:

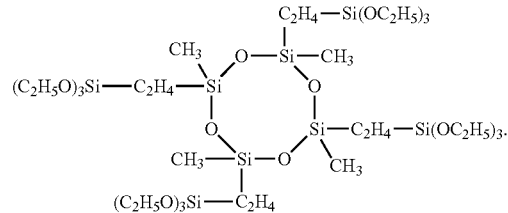

13. The imprinting apparatus as defined in claim 1, further comprising a silicon-based working stamp in contact with the anti-stick layer on the silicon master, wherein the silicon-based working stamp includes polymerized silicon acrylate monomers.

14. The imprinting apparatus as defined in claim 13, further comprising a backplane in contact with the working stamp.

15. The imprinting apparatus as defined in claim 1, wherein the molecule excludes fluorine.

16. A method, comprising:
   forming a master template by:
      depositing a formulation on a silicon master including a plurality of nanofeatures defined therein, each of the plurality of nanofeatures having at least one dimension ranging from about 1 nm to about 1000 nm, the formulation consisting of a solvent and a molecule having a cyclosiloxane with at least one silane functional group; and
      curing the formulation, thereby forming an anti-stick layer conformally coating the plurality of nanofeatures of the silicon master, the anti-stick layer consisting of a mixture of from about 65 wt % to less than 100 wt % of the molecule in its neat form and from greater than 0 wt % to about 35 wt % of an oligomer of the molecule;
   depositing a silicon-based working stamp material on the anti-stick layer of the master template;
   curing the silicon-based working stamp material to form a working stamp including a negative replica of the plurality of nanofeatures; and
   releasing the working stamp from the master template.

17. The method as defined in claim 16, wherein:
   the solvent has a boiling point of less than about 70° C.; and
   the molecule is present in the formulation in an amount of at least about 5 wt %.

18. The method as defined in claim 16, wherein the solvent is tetrahydrofuran or toluene, and wherein the silicon-based working stamp material includes a silicon acrylate monomer.

19. The method as defined in claim 16, wherein the depositing of the formulation and the depositing of the silicon-based working stamp material each involve spin coating.

20. The method as defined in claim 16, wherein the molecule is present in the formulation in an amount ranging from about 5 wt % to about 10 wt %, and wherein the released working stamp is at least substantially free of the molecule.

21. The method as defined in claim 16, wherein the molecule is:

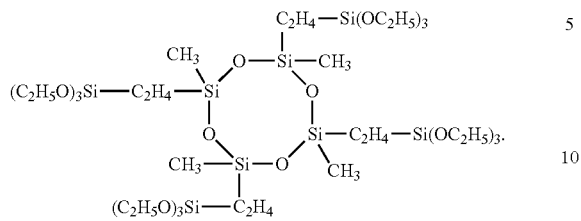

22. The method as defined in claim 16, wherein the molecule excludes fluorine.

23. The method as defined in claim 16, wherein the releasing of the working stamp provides a released master template with the anti-stick layer thereon, and further comprising:
   cleaning the released master template;
   depositing a second silicon-based working stamp material on the anti-stick layer of the cleaned released master template;
   curing the second silicon-based working stamp material to form a second working stamp including a negative replica of the plurality of nanofeatures; and releasing the second working stamp from the master template.

* * * * *